(12) United States Patent
Choi et al.

(10) Patent No.: US 10,240,841 B2
(45) Date of Patent: Mar. 26, 2019

(54) METHODS AND APPARATUS FOR DETERMINING POWER CONSUMPTION

(71) Applicant: LG ELECTRONICS INC., Seoul (KR)

(72) Inventors: Sangbok Choi, Seoul (KR); Kibae Lee, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 669 days.

(21) Appl. No.: 14/589,479

(22) Filed: Jan. 5, 2015

(65) Prior Publication Data
US 2015/0192337 A1    Jul. 9, 2015

(30) Foreign Application Priority Data

Jan. 6, 2014  (KR) .................. 10-2014-0001440

(51) Int. Cl.
*F25B 49/02*  (2006.01)
*D06F 33/02*  (2006.01)
(Continued)

(52) U.S. Cl.
CPC ............ *F25B 49/025* (2013.01); *D06F 25/00* (2013.01); *D06F 33/02* (2013.01); *D06F 39/005* (2013.01); *D06F 2202/12* (2013.01); *D06F 2204/10* (2013.01); *D06F 2210/00* (2013.01); *D06F 2216/00* (2013.01); *D06F 2226/00* (2013.01); *F25B 2500/19* (2013.01); *F25B 2600/021* (2013.01); *F25B 2600/024* (2013.01); *F25B 2700/151* (2013.01); *F25D 29/00* (2013.01); *Y02B 30/741* (2013.01); *Y02B 40/32* (2013.01)

(58) Field of Classification Search
CPC .. F25D 21/08; F25D 21/006; F25B 2700/151; F25B 2600/021; F25B 49/022; F25B 2500/19
See application file for complete search history.

(56) References Cited

U.S. PATENT DOCUMENTS 3,731,496 A  *  5/1973  Frazier .................... F25C 5/187
                                                           62/137
4,327,556 A      5/1982  Zampini et al.
(Continued)

FOREIGN PATENT DOCUMENTS

CN       1068423 C       7/2001
CN     201497765 U       6/2010
(Continued)

*Primary Examiner* — Frantz Jules
*Assistant Examiner* — Nelson Nieves
(74) *Attorney, Agent, or Firm* — Dentons US LLP

(57) ABSTRACT

A refrigerator includes a compressor, an input current detector to detect input current of alternating current (AC) power inputted to the refrigerator, a converter to convert the inputted AC power into direct current (DC) power, a capacitor to store the converted DC power, an inverter to output AC power using the converted DC power for driving of the compressor, a DC terminal voltage detector to detect voltage at two terminals of the capacitor, and a compressor microcomputer to control the inverter and to calculate refrigerator power consumption based on the detected input current and the detected DC terminal voltage. The refrigerator enables simplified power consumption calculation.

10 Claims, 11 Drawing Sheets

(51) Int. Cl.
*F25D 29/00* (2006.01)
*D06F 39/00* (2006.01)
*D06F 25/00* (2006.01)

(56) References Cited

U.S. PATENT DOCUMENTS

| | | | | |
|---|---|---|---|---|
| 4,460,123 A | * | 7/1984 | Beverly | F23N 1/002 236/46 R |
| 4,556,827 A | * | 12/1985 | Erdman | H02P 6/085 318/400.22 |
| 4,719,765 A | * | 1/1988 | Hooper | F25C 5/182 362/290 |
| 6,813,897 B1 | * | 11/2004 | Bash | F25B 27/00 307/64 |
| 2003/0056526 A1 | * | 3/2003 | Holmes | F25D 29/00 62/156 |
| 2003/0182951 A1 | * | 10/2003 | Rafalovich | F25D 21/006 62/154 |
| 2003/0182952 A1 | | 10/2003 | Brooke | |
| 2004/0144128 A1 | * | 7/2004 | Junge | F25D 17/045 62/441 |
| 2005/0235660 A1 | * | 10/2005 | Pham | F04C 28/00 62/126 |
| 2006/0056127 A1 | * | 3/2006 | Lewis | H02H 9/005 361/118 |
| 2006/0123807 A1 | * | 6/2006 | Sullivan | G01D 4/004 62/129 |
| 2006/0130504 A1 | | 6/2006 | Agrawal et al. | |
| 2006/0133120 A1 | * | 6/2006 | Sato | H02M 5/4585 363/37 |
| 2006/0162427 A1 | * | 7/2006 | Horie | F25B 49/005 73/40.7 |
| 2006/0201168 A1 | * | 9/2006 | Kates | F24F 11/0086 62/129 |
| 2008/0053120 A1 | * | 3/2008 | Nakai | F25B 13/00 62/157 |
| 2008/0150456 A1 | * | 6/2008 | Heo | F25B 49/025 318/119 |
| 2009/0237015 A1 | * | 9/2009 | Hashimoto | H02P 21/0089 318/400.02 |
| 2011/0088415 A1 | * | 4/2011 | Lacey | F25B 47/02 62/80 |
| 2011/0209487 A1 | * | 9/2011 | Tachiki | F24F 11/0086 62/129 |
| 2011/0224947 A1 | * | 9/2011 | Kriss | F24F 3/1603 702/179 |
| 2011/0225992 A1 | * | 9/2011 | Lee | F24F 1/0003 62/80 |
| 2011/0270456 A1 | * | 11/2011 | Kouda | H02J 13/0075 700/292 |
| 2012/0042667 A1 | * | 2/2012 | Fulmer | F25D 21/006 62/80 |
| 2012/0047921 A1 | * | 3/2012 | Besore | F25D 21/06 62/80 |
| 2012/0055181 A1 | * | 3/2012 | Kim | F25D 21/02 62/80 |
| 2012/0065806 A1 | * | 3/2012 | Recio | D06F 33/02 700/298 |
| 2012/0280645 A1 | * | 11/2012 | Olsson | H02P 23/0077 318/802 |
| 2012/0296479 A1 | * | 11/2012 | Millar | G05D 23/1923 700/277 |
| 2013/0000330 A1 | * | 1/2013 | Tsuruma | F25B 49/025 62/126 |
| 2013/0025303 A1 | * | 1/2013 | Yoon | F25B 49/022 62/89 |
| 2013/0086928 A1 | * | 4/2013 | Cho | F25D 21/006 62/80 |
| 2013/0192280 A1 | * | 8/2013 | Kim | F25D 21/06 62/80 |
| 2013/0247600 A1 | * | 9/2013 | Lu | B64D 13/08 62/89 |
| 2013/0301323 A1 | * | 11/2013 | Iyasu | H02M 7/797 363/123 |
| 2014/0033744 A1 | * | 2/2014 | Kim | F25D 21/002 62/80 |
| 2014/0053581 A1 | * | 2/2014 | Cho | F25D 21/008 62/80 |
| 2014/0123690 A1 | * | 5/2014 | Hanley | F25D 21/006 62/80 |
| 2014/0137580 A1 | * | 5/2014 | Peyaud | F25B 41/04 62/80 |
| 2014/0182318 A1 | * | 7/2014 | Eom | F25B 49/02 62/129 |
| 2014/0207501 A1 | * | 7/2014 | Albee | G06Q 10/063 705/7.11 |
| 2015/0033773 A1 | * | 2/2015 | Tajima | F25D 17/045 62/80 |
| 2015/0089972 A1 | * | 4/2015 | Kamiya | F25B 13/00 62/467 |
| 2015/0219378 A1 | * | 8/2015 | Crane | F25B 49/022 62/115 |
| 2015/0365008 A1 | * | 12/2015 | Ogino | H02M 1/14 363/37 |

FOREIGN PATENT DOCUMENTS

| | | |
|---|---|---|
| CN | 201562149 U | 8/2010 |
| CN | 102778103 A | 11/2012 |
| CN | 103487645 A | 1/2014 |
| EP | 0697569 A1 | 2/1996 |
| EP | 1990591 A1 | 11/2008 |

* cited by examiner

METHODS AND APPARATUS FOR DETERMINING POWER CONSUMPTION

CROSS-REFERENCE TO RELATED APPLICATION

This application claims the priority benefit of Korean Patent Application No. 10-2014-0001440, filed on 6 Jan. 2014 in the Korean Intellectual Property Office, the disclosure of which is incorporated herein by reference.

BACKGROUND

1. Field of the Disclosure

The present disclosure relates to refrigerators and home appliances and, more particularly, to refrigerators and home appliances which are capable of performing power consumption calculation in a simplified manner.

2. Background

Generally, refrigerators serve to keep food fresh for a long period. Such a refrigerator is comprised of a freezing compartment in which food is kept at a freezing temperature or lower, a refrigerating compartment in which food is kept at a temperature above the freezing temperature, and having a refrigeration cycle for cooling of the freezing compartment and the refrigerating compartment. Operation of the refrigerator is controlled by a controller equipped in the refrigerator.

A kitchen space containing a refrigerator is not simply a space for dietary life, but has changed to a more important living space than ever before for conversation between family members as well as dietary life and other purposes. Therefore, there is a need to enlarge a refrigerator that is a core component of the kitchen space and to achieve quantitative and qualitative functional change for easy use by all family members.

SUMMARY

Therefore, one object is to provide a refrigerator and a home appliance which are capable of performing power consumption calculation in a simplified manner.

In accordance with one embodiment of the present invention, the above and other objects may be accomplished by the provision of a refrigerator including a compressor, an input current detector to detect input current of alternating current (AC) power inputted to the refrigerator, a converter to convert the inputted AC power into direct current (DC) power, a capacitor to store the converted DC power, an inverter to output AC power using the converted DC power for driving of the compressor, a DC terminal voltage detector to detect voltage at two terminals of the capacitor, and a compressor microcomputer to control the inverter and to calculate refrigerator power consumption based on the detected input current and the detected DC terminal voltage.

In accordance with another embodiment of the present invention, there is provided a home appliance including an input current detector to detect input current of alternating current (AC) power inputted to the home appliance, a converter to convert the inputted AC power into direct current (DC) power, a capacitor to store the converted DC power, an inverter to output AC power to a load using the converted DC power, a DC terminal voltage detector to detect voltage at two terminals of the capacitor, and a motor microcomputer to control the inverter and to calculate home appliance power consumption based on the detected input current and the detected DC terminal voltage.

BRIEF DESCRIPTION OF THE DRAWINGS

The above and other objects, features and advantages will be more clearly understood from the following detailed description taken in conjunction with the accompanying drawings, in which.

DETAILED DESCRIPTION OF THE PREFERRED EMBODIMENTS

Hereinafter, the present disclosure will be described in detail with reference to the accompanying drawings.

With respect to constituent elements used in the following description, suffixes "module" and "unit" are given or mingled with each other only in consideration of ease in the preparation of the specification, and do not have or serve as different meanings. Accordingly, the suffixes "module" and "unit" may be mingled with each other. It should be noted that"module" and "unit" may be hardware or a controller executing a sequence of instructions stored in a memory, for instance.

Figure 1:
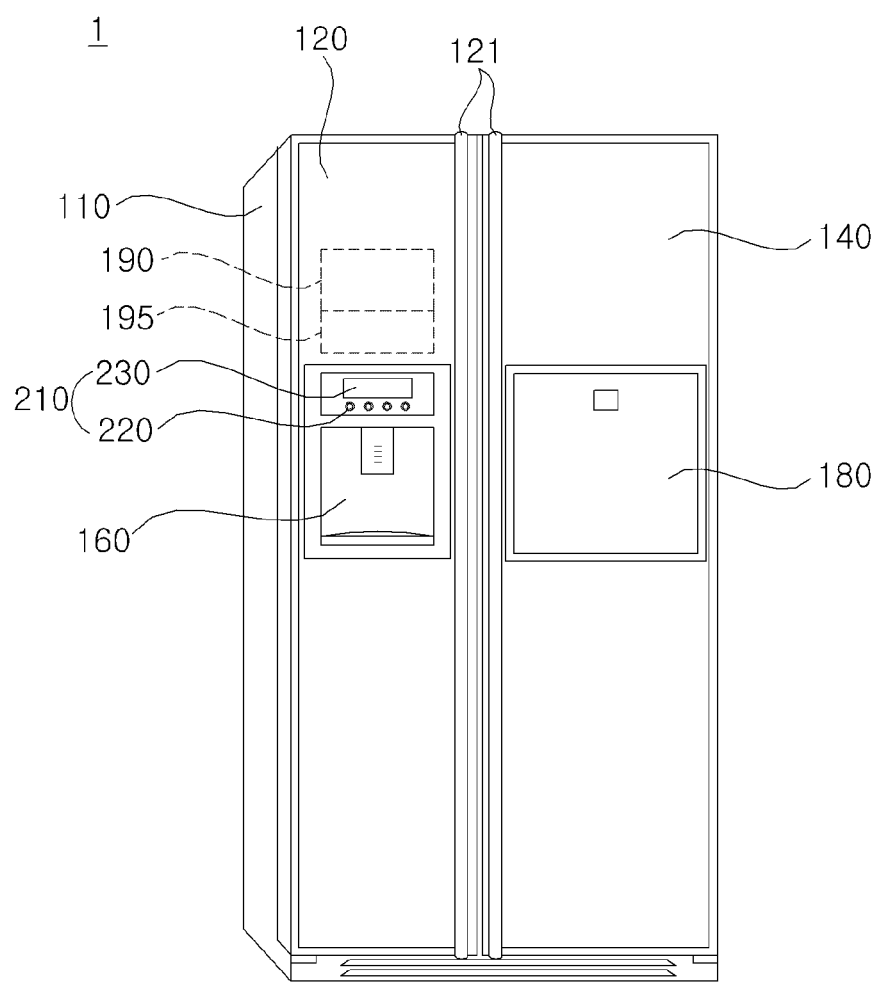
FIG. 1 is a perspective view showing a refrigerator according to an embodiment of the present invention.

FIG. 1 is a perspective view showing a refrigerator according to an embodiment of the present invention.

The refrigerator 1 includes a case 110, which has an inner space divided into a freezing compartment and a refrigerating compartment (not shown in FIG. 1), a freezing compartment door 120 to shield the freezing compartment, and a refrigerating compartment door 140 to shield the refrigerating compartment, the case 110 and the doors 120 and 140 defining an outer appearance of the refrigerator 1.

The freezing compartment door 120 and the refrigerating compartment door 140 may be provided at front surfaces thereof with forwardly protruding door handles 121 respectively to assist a user in easily pivoting the freezing compartment door 120 and the refrigerating compartment door 140 by gripping the door handles 121.

The refrigerating compartment door 140 may further be provided at a front surface thereof with a so-called home bar 180 that allows the user to conveniently retrieve stored items, such as beverages, without opening the refrigerating compartment door 140.

The freezing compartment door 120 may further be provided at a front surface thereof with a dispenser 160 that allows the user to easily and conveniently retrieve ice or drinking water without opening the freezing compartment door 120. The freezing compartment door 120 may further be provided with a control panel 210 at the upper side of the dispenser 160. The control panel 210 serves to control driving operation of the refrigerator 1 and to display a screen showing a current operating state of the refrigerator 1.

While the dispenser 160 is shown in FIG. 1 as being located at the front surface of the freezing compartment door 120, the present invention is not limited thereto and the dispenser 160 may be located at the front surface of the refrigerating compartment door 140.

In addition, the freezing compartment 155 (see FIG. 2) may accommodate, in an upper region thereof, an icemaker 190 used to make ice using water supplied thereto and cold air within the freezing compartment and an ice bank 195 located under the icemaker 190 to receive ice released from the icemaker 190. In addition, although not shown in FIG. 2, an ice chute may be used to guide the ice received in the ice bank 195 to fall into the dispenser 160. The icemaker 190 will be described below in more detail with reference to FIG. 3.

Referring to FIG. 1, the control panel 210 may include an input unit 220 having a plurality of buttons and a display 230 to display control screens, operating states, and the like.

The display 230 displays control screens, operating states, and other information, such as an internal temperature of the refrigerator, etc. For example, the display 230 may display a service type of the dispenser 160 (ice cubes, water, crushed ice), a set temperature of the freezing compartment, and a set temperature of the refrigerating compartment.

The display 230 may be any one of liquid crystal display (LCD), light emitting diode (LED), and organic light emitting diode (OLED) units and the like. In one embodiment, the display 230 may be a touchscreen that may additionally perform a function of the input unit 220.

The input unit 220 may include a plurality of operation buttons. For example, the input unit 220 may include a dispenser setting button to set a service type of the dispenser (ice cubes, water, crushed ice), a freezing compartment temperature setting button to set a temperature of the freezing compartment, and a refrigerating compartment temperature setting button to set a temperature of the refrigerating compartment. In one embodiment, the input unit 220 may be a touchscreen that may additionally perform a function of the display 230.

The refrigerator according to embodiments of the present invention is not limited to a double door type shown in FIG. 1, and may be any one of a one door type refrigerator, a sliding door type refrigerator, a curtain door type refrigerator and others. A refrigerator comprising an ice bank 195 and an ice bank vibrator 175 to vibrate the ice bank 195 placed in the freezing compartment according to one embodiment of the present invention will be described below.

Figure 2:
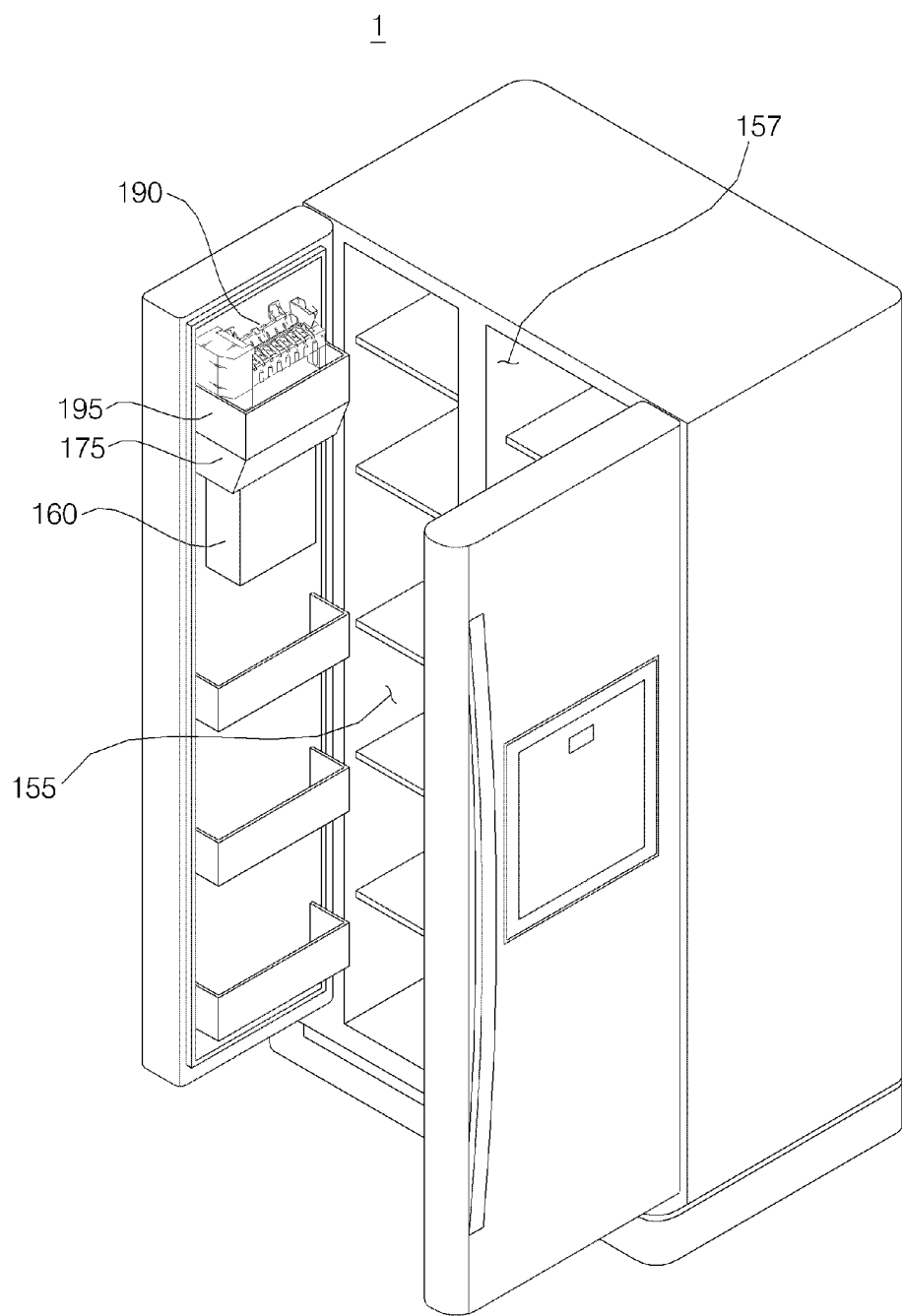
FIG. 2 is a perspective view showing an opened state of doors included in the refrigerator shown in FIG. 1.

FIG. 2 is a perspective view showing an opened state of the doors included in the refrigerator shown in FIG. 1.

In explaining with reference to FIG. 2, a freezing compartment 155 is defined inside the freezing compartment door 120 and a refrigerating compartment 157 is defined inside the refrigerating compartment door 140.

Placed in an upper region of the freezing compartment 155 are the icemaker 190 that makes ice using water supplied thereto and cold air within the freezing compartment 155, the ice bank 195 that is located under the icemaker 190 to receive ice released from the icemaker 190, the ice bank vibrator 175 that vibrates the ice bank 195, and the dispenser 160. In addition, although not shown in FIG. 2, an ice chute may further be placed to guide the ice received in the ice bank 195 to fall into the dispenser 160.

Figure 3:
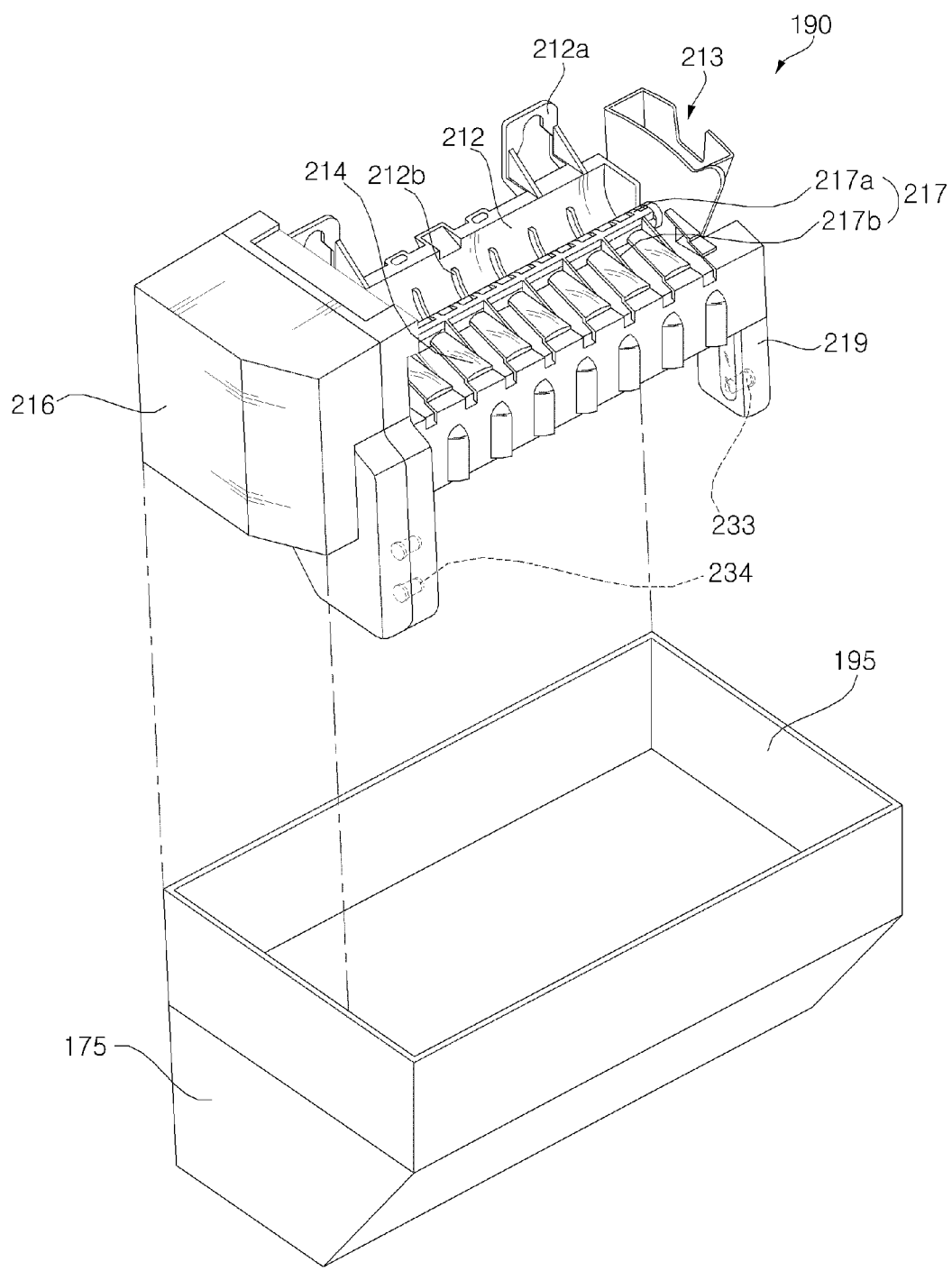
FIG. 3 is a view showing an icemaker shown in FIG. 2.

FIG. 3 is a view showing the icemaker shown in FIG. 2.

In explaining with reference to FIG. 3, the icemaker 190 includes an ice making tray 212 in which water for making ice is received and made into a given shape of ice, a water feeder 213 to feed water into the ice making tray 212, a slider 214 along which the made ice slides down to the ice bank 190, and a heater (not shown) to separate the finished ice from the ice making tray 212.

The ice making tray 212 may be fastened to the freezing compartment 155 of the refrigerator via one or more fastening pieces 212a.

In addition, the icemaker 190 further includes an ice making driver 216 to operate an ejector 217. The ejector 217 is coupled to a motor (not shown) of the driver 216 via a shaft and serves to expel the ice, e.g., ice cubes, completely made in the ice making tray 212 into the ice bank 195.

The ice making tray 212 has an approximately semi-cylindrical shape and is provided at an inner surface thereof with divider protrusions 212b. The divider protrusions 212b are spaced apart from one another by a prescribed distance to separate and expel the ice cubes.

The ejector 217 includes a shaft 217a extending across the center of the ice making tray 212, and a plurality of ejector pins 217b protruding from one side of the shaft 217a of the ejector 217.

Here, the ejector pins 217a are respectively located between the respective neighboring divider protrusions 212b of the ice making tray 212.

The ejector pins 217a serve to expel the made ice into the ice bank 195. For example, the ice cubes moved by the ejector pins 217a are released onto the slider 214 and then fall into the ice bank 195 by sliding on the slider 214.

Although not shown in FIG. 3, the heater is attached to a lower surface of the ice making tray 212 and serves to increase a temperature of the ice making tray 212 when it is necessary to melt ice adhered to the inner surface of the ice making tray 212 for separation of the ice from the ice making tray 212. The separated ice is discharged into the ice bank 195 by the ejector 217.

The icemaker 190 may further include a light transmitter 233 and a light receiver 234, which serve to sense whether or not the ice bank 195 located under the ice making tray 212 is full of ice (hereinafter referred to as "ice full sensing"). In one embodiment, "ice full sensing" is performed before separation of the ice from the ice making tray 212.

The light transmitter 233 and the light receiver 234 may be arranged at a lower end of the icemaker 190 and transmit or receive light to or from the ice bank 195 using infrared sensors, light emitting diodes (LEDs) or the like.

For example, in the case of an infrared sensor type, the infrared transmitter 233 and the infrared receiver 234 are respectively located at a lower end of the icemaker 190. The infrared receiver 234 will receive a high level signal when the ice bank 195 is not full of ice, and receive a low level signal when the ice bank 195 is full of ice. Thereby, a main microcomputer 310 (see FIG. 5) judges whether or not the ice bank 195 is full of ice. Here, one or more infrared receivers 234 may be used, and FIG. 3 shows two infrared receivers 234.

The light transmitter 233 and the light receiver 234 may be embedded in a lower case 219 of the icemaker 190 for protection of elements against moisture, frost, etc., due to ice.

The signal, received by the light receiver 234, is inputted to the main microcomputer 310. Upon ice full sensing, the main microcomputer 310 controls operation of the ice making driver 216 such that ice is no longer expelled into the ice bank 195.

The ice bank vibrator 175 to vibrate the ice bank 195 may be located at the underside of the ice bank 195. While the ice bank vibrator 175 is shown in FIG. 3 as being located at the underside of the ice bank 195, the present invention is not limited thereto, and the ice bank vibrator 175 may be located at any position adjacent to the ice bank 195, such as a position at a side surface of the ice bank 195, so long as the ice bank vibrator 175 can vibrate the ice bank 195.

Figure 4:
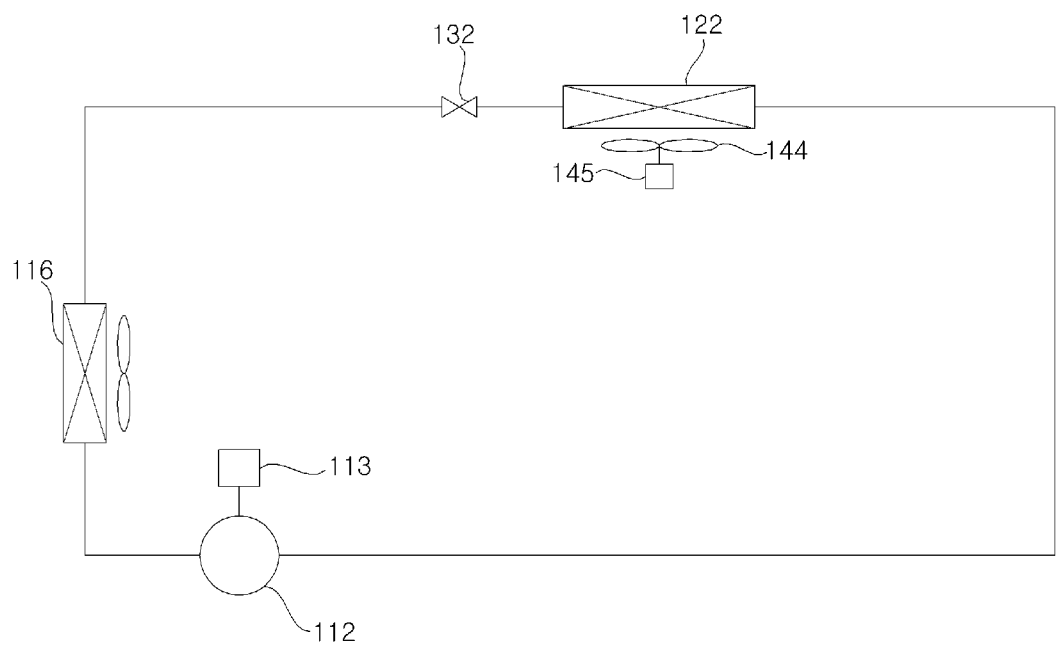
FIG. 4 is a view schematically showing a configuration of the refrigerator shown in FIG. 1.

FIG. 4 is a view schematically showing a configuration of the refrigerator shown in FIG. 1.

In explaining with reference to FIG. 4, the refrigerator 1 may include a compressor 112, a condenser 116 to condense refrigerant compressed in the compressor 112, a freezing compartment evaporator 122 placed in the freezing compartment (not shown) to evaporate the condensed refrigerant directed from the condenser 116, and a freezing compartment expansion valve 132 to expand the refrigerant to be directed to the freezing compartment evaporator 122.

While FIG. 4 shows use of a single evaporator by way of example, evaporators may be respectively placed in the freezing compartment and the refrigerating compartment.

That is, the refrigerator 1 may further include a refrigerating compartment evaporator (not shown) placed in the refrigerating compartment (not shown), a 3-way valve (not shown) to direct the condensed refrigerant from the condenser 116 to the refrigerating compartment evaporator (not shown) or the freezing compartment evaporator 122, and a refrigerating compartment expansion valve (not shown) to expand the refrigerant to be directed to the refrigerating compartment evaporator (not shown).

In addition, the refrigerator 1 may further include a gas-liquid separator (not shown) in which the refrigerant having passed through the freezing compartment evaporator 122 is divided into liquid and gas.

The refrigerator 1 may further include a refrigerating compartment fan (not shown) and a freezing compartment fan 144, which suction cold air having passed through the freezing compartment evaporator 122 and blow the cold air to the refrigerating compartment (not shown) and the freezing compartment (not shown) respectively.

The refrigerator 1 may further include a compressor driver 113 to drive the compressor 112, a refrigerating compartment fan driver (not shown) to drive the refrigerating compartment fan (not shown), and a freezing compartment fan driver 145 to drive the freezing compartment fan 144.

Meanwhile, in the case in which the common evaporator 122 is used in the freezing compartment and the refrigerating compartment as shown in FIG. 4, a damper (not shown) may be installed between the freezing compartment and the refrigerating compartment, and a fan (not shown) may forcibly blow cold air generated by the single evaporator to the freezing compartment and the refrigerating compartment.

Figure 5:
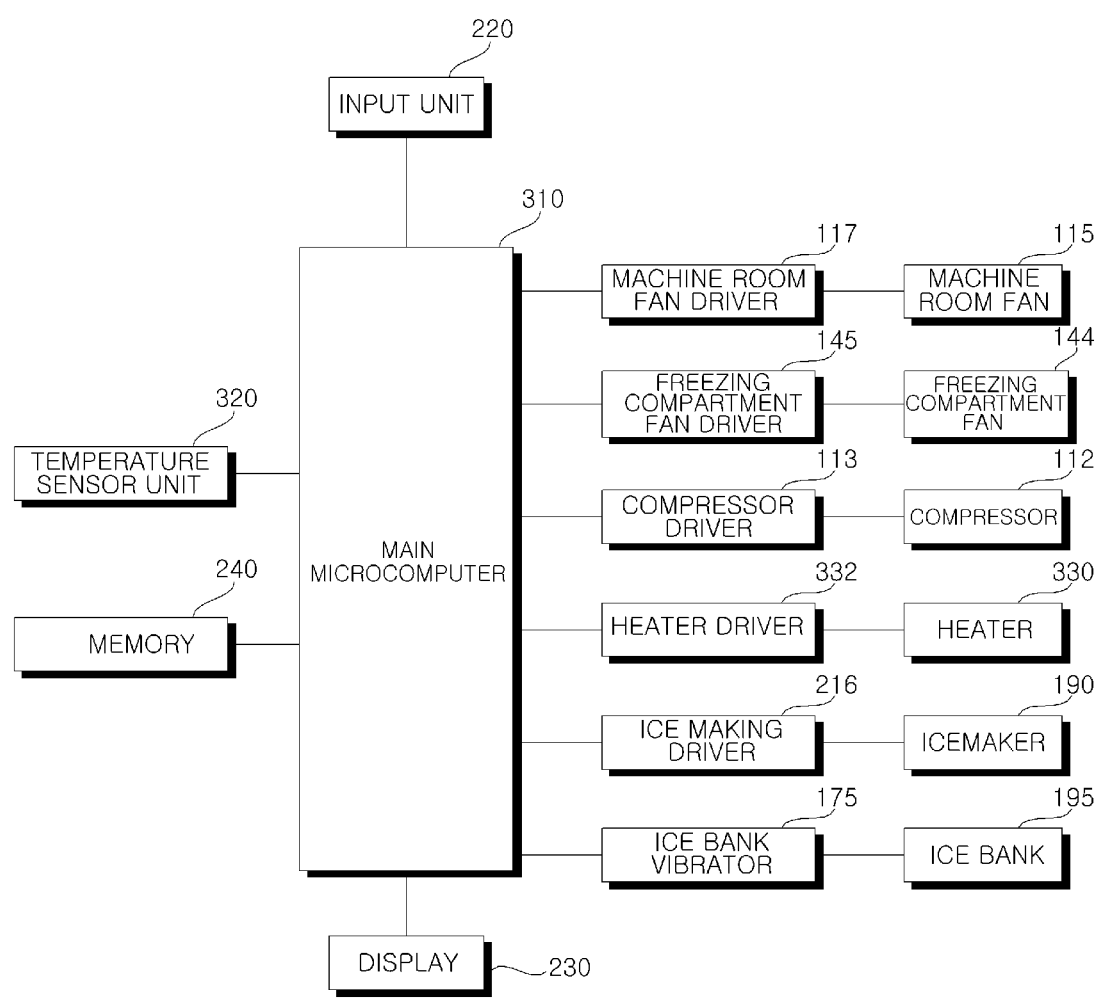
FIG. 5 is a block diagram schematically showing internal components of the refrigerator shown in FIG. 1.

FIG. 5 is a block diagram schematically showing internal components of the refrigerator shown in FIG. 1.

In explaining with reference to FIG. 5, the refrigerator may include the compressor 112, a machine room fan 115, the freezing compartment fan 144, the main microcomputer 310, a heater 330, the icemaker 190, the ice bank 195, a temperature sensor unit 320, and a memory 240. In addition, the refrigerator may further include the compressor driver 113, a machine room fan driver 117, the freezing compartment fan driver 145, a heater driver 332, the ice making driver 216, the ice bank vibrator 175, the display 230, and the input unit 220.

The input unit 220 includes a plurality of operation buttons and transmits a signal related to an input freezing compartment set temperature or an input refrigerating compartment set temperature to the main microcomputer 310.

The display 230 may display an operating state of the refrigerator. In particular, in relation to an embodiment of the present invention, the display 230 may display final power consumption information, or accumulated power consumption information based on the final power consumption. The display 230 is operable under control of the main microcomputer 310.

The memory 240 may store data required to operate the refrigerator. In particular, in relation to an embodiment of the present invention, as exemplarily shown in FIG. 5, the memory 240 may store power consumption information regarding each of a plurality of power consuming units. In addition, the memory 240 may output corresponding power consumption information to the main microcomputer 310 according to whether the respective power consuming units included in the refrigerator are operated or not.

In addition, the memory 240 may store information regarding distribution of elements of a plurality of power consuming units.

The temperature sensor unit 320 senses an internal temperature of the refrigerator and transmits a signal related to the sensed temperature to the main microcomputer 310. Here, the temperature sensor unit 320 may include sensors to sense a refrigerating compartment temperature and a freezing compartment temperature respectively. In addition, the temperature sensor unit 320 may sense a temperature of each chamber within the refrigerating compartment or a temperature of each chamber within the freezing compartment.

The main microcomputer 310 may control the compressor driver 113 and the fan driver 117 or 145 as exemplarily shown in FIG. 5 to control turn-on/turn-off of the compressor 112 and the fan 115 or 144, thereby finally controlling the compressor 112 and the fan 115 or 144. Here, the fan driver may be the machine room fan driver 117 or the freezing compartment fan driver 145.

For example, the main microcomputer 310 may output a speed command signal corresponding to the compressor driver 113 or the fan driver 117 or 145.

The compressor driver 113 and the freezing compartment fan driver 145 as described above respectively include a compressor motor (not shown) and a freezing compartment fan motor (not shown), and these motors (not shown) may be operated respectively at target rotation speeds under control of the main microcomputer 310.

The machine room fan driver 117 may include a machine room fan motor (not shown), and the machine room fan motor (not shown) may be operated at a target rotation speed under control of the main microcomputer 310.

In the case in which the aforementioned motors are three phase motors, the motors may be controlled by switching operation in an inverter (not shown), or may be controlled to a constant speed using alternating current (AC) power. Here, the respective motors (not shown) may be any one of an induction motor, a blushless direct current (BLDC) motor, a synchronous reluctance (synRM) motor, and the like.

Meanwhile, the main microcomputer 310, as described above, may control general operations of the refrigerator 1, in addition to controlling operations of the compressor 112 and the fan 115 or 144.

For example, the main microcomputer 310 may control operation of the ice bank vibrator 175. In particular, upon ice full sensing, the main microcomputer 310 may control discharge of ice from the icemaker 190 to the ice bank 195 and also control vibration of the ice bank 195 during the discharge of ice or within a prescribed time after the discharge of ice using the ice vibrator 175. Vibration of the ice bank 195 during the discharge of ice may ensure even distribution of ice within the ice bank 195 without clustering of ice.

In addition, to prevent clustering of ice when the ice is kept in the ice bank 195 for a long time, the main microcomputer 310 may cause vibration of the ice bank 195 repeatedly at a prescribed time interval.

In addition, when the dispenser 160 is operated by user operation, the main microcomputer 310 may control discharge of ice from the ice bank 195 to the dispenser 160, and also control vibration of the ice bank 195 during the discharge of ice or immediately before the discharge of ice. More specifically, the main microcomputer 310 may control the ice bank vibrator 175 to vibrate the ice bank 195. In this way, it is possible to prevent clustering of ice to be discharged to the user via the dispenser 160.

The main microcomputer 310 may control operation of the heater (not shown) included in the icemaker 190 for separation of ice from the ice making tray 212.

Then, after the heater (not shown) is turned on, the main microcomputer 310 may control operation of the ejector 217 included in the icemaker 190 by controlling the ice making driver 216. This serves to control operation to smoothly discharge ice from the icemaker 190 into the ice bank 195.

Meanwhile, upon judgment that the ice bank 195 is full of ice, the main microcomputer 310 may control the heater (not shown) to be turned off. In addition, the main microcomputer 310 may control the ejector 217 included in the icemaker 190 to stop operation.

In addition, as described above, the main microcomputer 310 may control general operations of a refrigerant cycle to match a set temperature from the input unit 220. For example, the main microcomputer 310 may further control the 3-way valve (not shown), the refrigerating compartment expansion valve (not shown) and the freezing compartment expansion valve 132, in addition to controlling the compressor driver 113, the refrigerating compartment fan driver (not shown) and the freezing compartment fan driver 145. Then, the main microcomputer 310 may control operation of the condenser 116. In addition, the main microcomputer 310 may control operation of the display 230.

The heater 330 may be a freezing compartment defrosting heater. The freezing compartment defrosting heater 330 may be operated to remove frost from the freezing compartment evaporator 122. To this end, the heater driver 332 may control operation of the heater 330. Meanwhile, the main microcomputer 310 may control the heater driver 332.

Figure 6:
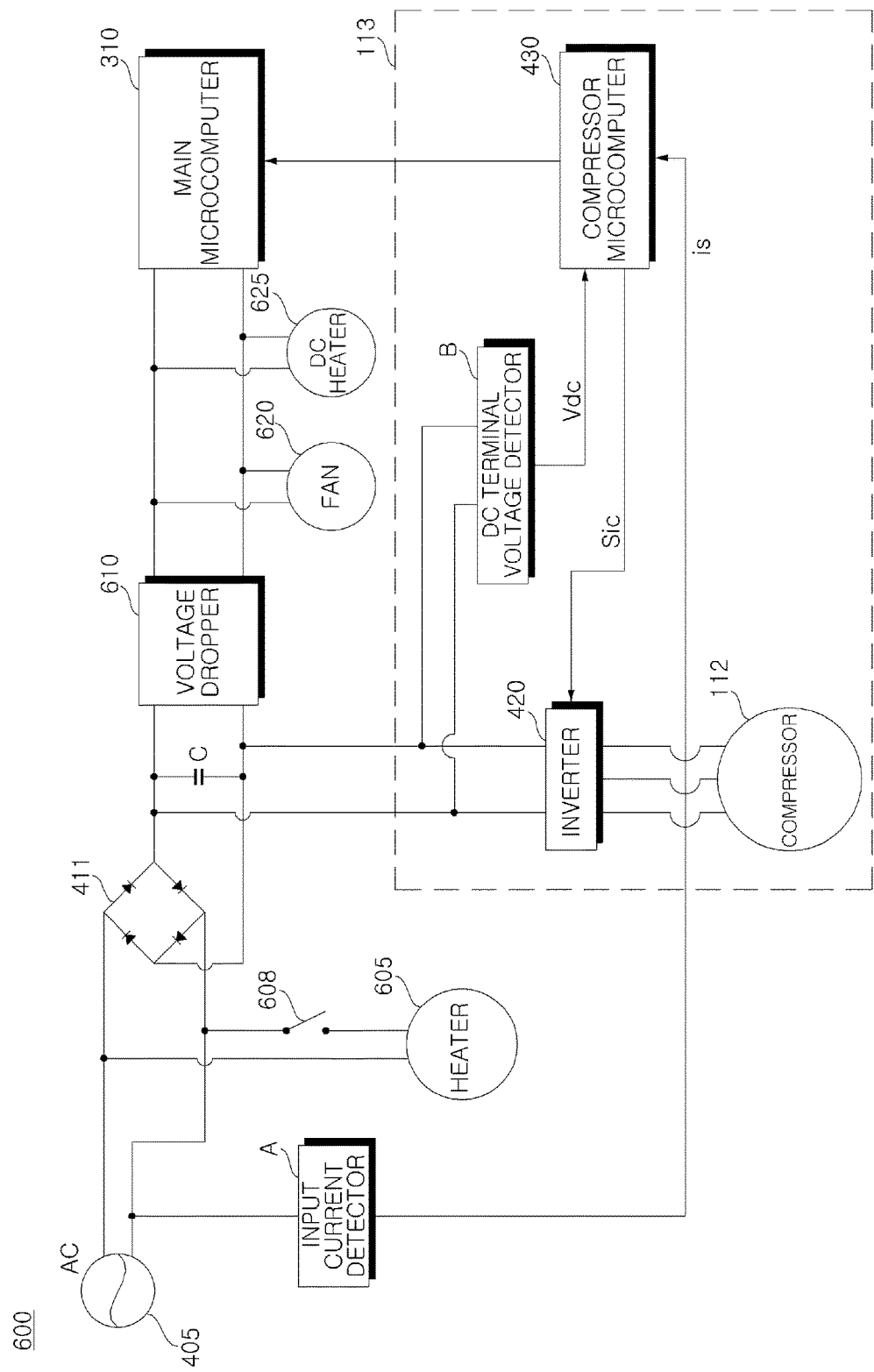
FIG. 6 is a view showing an internal circuit of the refrigerator shown in FIG. 1.

FIG. 6 is a view showing an internal circuit of the refrigerator shown in FIG. 1.

First, referring to FIG. 6, the circuit 600 may include at least one circuit board installed in the refrigerator.

Specifically, the circuit 600 may include a rectifier 411, a capacitor C, a voltage dropper 610, a fan 620, a DC heater 625, the main microcomputer 310, a relay 608, a heater 605, an input current detector A, a DC terminal voltage detector B, an inverter 420, and a compressor microcomputer 430.

First, the input current detector A may detect input current is from the commercial AC power source 405. To this end, the input current detector A may use a current transformer (CT), a shunt resistor, or the like. The detected input current is a discrete pulse signal inputted to the compressor microcomputer 430 for power consumption calculation.

The rectifier 411 rectifies AC power from the commercial AC power source 405 and outputs the rectified power. While FIG. 6 shows the rectifier 411 as having bridge diodes, various alterations are possible.

Figure 7:
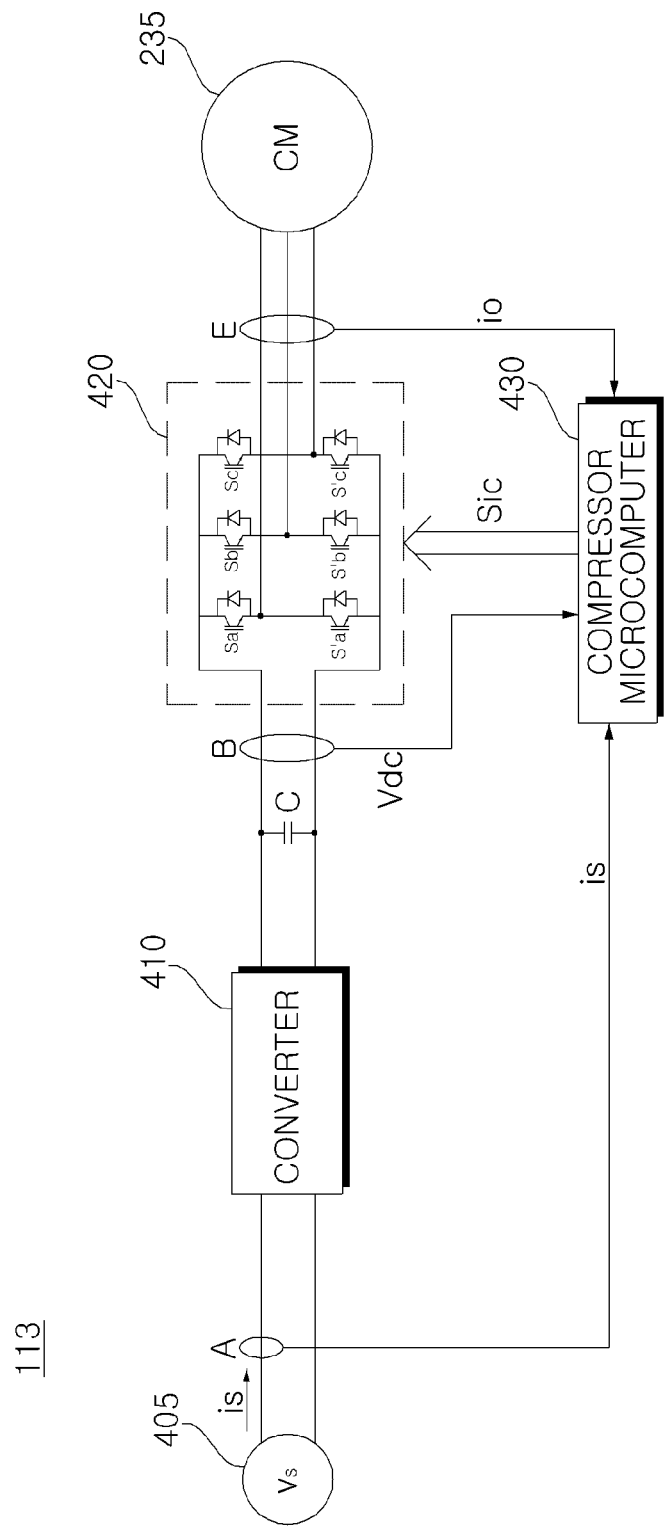
FIG. 7 is a circuit diagram showing a compressor driver shown in FIG. 6.

The rectifier 411 may be one example of a converter 410 shown in FIG. 7 because the rectifier 411 converts AC power into DC power.

The relay 608 may be located between the commercial AC power source 405 and the rectifier 411 to drive the AC heater 605 equipped in the refrigerator 1. The AC heater 605 may be operated via turn-on operation of the relay 608.

Next, the capacitor C may be located at an output terminal of the rectifier 411 to store or smooth the rectified power. In this case, two terminals of the capacitor C may be named DC terminals. Thus, the capacitor C may be referred to as a DC terminal capacitor.

Voltage at the two terminals of the DC terminal capacitor C, i.e., DC terminal voltage Vdc may be used to operate the main microcomputer 310 or to operate the compressor 112. The drawing shows that the DC terminal voltage is used to operate both the main microcomputer 310 and the compressor 112.

The DC terminal voltage may be within a range of 200V to 300V and voltage drop is required to drive the main microcomputer 310 that is operated by scores of voltage.

The voltage dropper 610 may convert the input DC power to generate power for operation of respective units included in the circuit 600. Here, the operation power may be DC power. To this end, the voltage dropper 610 may include a switched mode power supply (SMPS) having switching elements.

The DC power dropped to approximately 15V may be inputted to the fan 620, the DC heater 625 and the main microcomputer 310. Then, the fan 620, the DC heater 625 and the main microcomputer 310 may be operated based on the dropped DC power.

The DC terminal voltage detector B may detect DC terminal voltage Vdc at two terminals of the smoothing capacitor C. To this end, the DC terminal voltage detector B may include at least one of a voltage transformer, a shunt resistor, an amplifier and the like. The detected DC terminal voltage Vdc may be a discrete pulse signal inputted to the compressor microcomputer 430 for power consumption calculation.

The inverter 420 may drive the compressor 112. In particular, the inverter 420 may drive a compressor motor (see 235 of FIG. 7) included in the compressor 112.

To this end, the inverter 420 may include a plurality of inverter switching elements. The inverter 420 may convert the DC terminal voltage into three phase AC voltage having a prescribed frequency as the switching elements are turned on or off, thereby outputting the AC voltage to the compressor motor (see 235 of FIG. 7).

The compressor microcomputer 430 may output a switching control signal Sic for driving of the compressor 112 to the inverter 420.

Meanwhile, the compressor microcomputer 430 may calculate power consumption of the entire refrigerator 1 based on the input current is detected by the input current detector A and the DC terminal voltage Vdc detected by the DC terminal voltage detector B.

This power consumption calculation may be performed based on the following Equation 1.

$$P = V_{dc} \times I_{SRMS} \times pf \quad \text{Equation 1}$$

Here, P is refrigerator power consumption, Vdc is detected DC terminal voltage, $I_{SRMS}$ is a virtual value of input current, and pf is a power factor.

In this case, the power factor may vary according to whether the compressor 112 is operated or not and whether the AC heater 605 for defrosting operation is operated or not.

For example, pf may be set to pf1 when the compressor 112 is operated to supply cold air into a freezing compartment, and may be set to pf2 when the compressor 112 is operated to supply cold air into a refrigerating compartment. Pf may be set to pf3 when the AC heater 605 for defrosting operation is operated without operation of the compressor 112.

In this case, a relational expression of pf1<pf2<pf3 may be established. That is, pf3 with regard to operation of the AC heater 605 for defrosting operation may have the greatest value.

These power factor values may be stored in a table, and the resulting power factor table may be stored in the memory 240 of the refrigerator, or may be stored in the compressor microcomputer 430.

Then, the compressor microcomputer 430 may transmit the calculated refrigerator power consumption to the main microcomputer 310.

As described above, by calculating power consumption of the entire refrigerator 1 based on the input current is detected by the input current detector A and the DC terminal voltage Vdc detected by the DC terminal voltage detector B, power consumption of the refrigerator 1 may be calculated in a simplified manner. In particular, refrigerator power consumption is calculated based on whether the AC heater 605 and the compressor 112 are operated or not, which enables accurate power consumption calculation.

Next, the main microcomputer 310 may output the power consumption, calculated by the compressor microcomputer 430, as final power consumption. As such, the display 230 may display the final power consumption.

In this case, the display 230 may display refrigerator power consumption for a first period (e.g., one day), or may display refrigerator power consumption for a second period (e.g., one month).

Alternatively, the display 230 may display whether refrigerator power consumption increases or decreases via comparison of power consumption for different periods. Alternatively, the display 230 may display whether power consumption costs with respect to refrigerator power consumption increases or decreases.

In addition, the display 230 may display information regarding refrigerator power consumption at a given cycle, or may display information regarding refrigerator power consumption for a given time (e.g., 15 minutes). This assists the user in intuitively recognizing refrigerator power consumption.

FIG. 7 is a circuit diagram showing a compressor driver shown in FIG. 6.

Referring to FIG. 7, the compressor driver 113 according to an embodiment of the present invention may include the converter 410, the inverter 420, the compressor microcomputer 430, the DC terminal voltage detector B, the smoothing capacitor C, and the output current detector E. The compressor driver 113 may further include the input current detector A. The input current detector A is preferably identical to the input current detector A of FIG. 6.

The converter 410 converts AC power from the commercial AC power source 405 into DC power and outputs the DC power. While FIG. 7 shows the commercial AC power source 405 as a single phase AC power source, the commercial AC power source 405 may be a three phase AC power source. An inner structure of the converter 410 is variable according to the kind of the commercial AC power source 405.

Meanwhile, the converter 410 may include diodes and the like without switching elements, and perform rectification operation without separate switching operation.

For example, the converter 410 may include four bridge diodes when a single phase AC power source is used, and may include six bridge diodes when a three phase AC power source is used.

Alternatively, the converter 410 may be a half bridge type converter including a combination of two switching elements and four diodes. In particular, when three phase AC power source is used, the converter 410 may include six switching elements and six diodes.

In the case of including switching elements, the converter 410 may perform voltage boosting, power factor improvement, and DC power conversion via switching operation of the corresponding switching elements.

The capacitor C serves to smooth and store inputted power. The capacitor C may be identical to the capacitor C of FIG. 6.

The DC terminal voltage detector B may detect DC terminal voltage Vdc at two terminals of the smoothing capacitor C. To this end, the DC terminal voltage detector B may include a resistor, an amplifier and the like. The detected DC terminal voltage Vdc may be a discrete pulse signal inputted to the compressor microcomputer 430. The DC terminal voltage detector B may be identical to the DC terminal voltage detector B of FIG. 6.

The inverter 420 may include a plurality of inverter switching elements, and convert DC power Vdc, smoothed as the switching elements are turned on or off, into three phase AC power va, vb and vc having a prescribed frequency and output the same to a three phase synchronous motor 235.

The inverter 420 includes upper arm switching elements Sa, Sb and Sc and lower arm switching elements S'a, S'b and S'c, which are respectively connected to each other in series. As such, a total of three pairs of upper arm and lower arm switching elements Sa &S'a, Sb&S'b and Sc& S'c are acquired. Anti-parallel diodes are connected to the respective switching elements Sa, S'a, Sb, S'b, Sc and S'c.

The switching elements included in the inverter 420 are turned on or off based on the inverter switching control signal Sic from the compressor microcomputer 430. Thereby, the inverter 420 outputs three phase AC power having a prescribed frequency to the three phase synchronous motor 235.

The compressor microcomputer 430 may control switching operation of the inverter 420. To this end, the compressor microcomputer 430 may receive output current io detected by the output current detector E.

The compressor microcomputer 430 outputs the inverter switching control signal Sic to the inverter 420, in order to control switching operation of the inverter 420. The inverter switching control signal Sic is a pulse width modulation (PWM) type switching control signal and is generated and outputted based on the output current io detected by the output current detector E. A detailed operation related to the output of the inverter switching control signal Sic by the compressor microcomputer 430 will be described below with reference to FIG. 8.

The output current detector E detects the output current io flowing between the inverter 420 and the three phase motor 235. That is, the output current detector E detects current flowing to the motor 235. The output current detector E may detect all of three phase current ia, ib and ic, or may detect two phase output current using three phase balance.

The output current detector E may be located between the inverter 420 and the motor 235, and may use a current transformer (CT), a shunt resistor, or the like for current detection.

In the case of using a shunt resistor, three shunt resistors may be located between the inverter 420 and the synchronous motor 235, or may be respectively connected at one end thereof to the three lower arm switching elements S'a, S'b and S'c of the inverter 420. Alternatively, two shunt resistors may be used based on three phase balance. Alternatively, a single shunt resistor may be located between the above-described capacitor C and the inverter 420.

The detected output current io may be a discrete pulse signal applied to the compressor microcomputer 430. The inverter switching control signal Sic is generated based on the detected output current io. The following description is under the assumption that the detected output current io is three phase output current ia, ib and ic.

The compressor motor 235 may be a three phase motor. The compressor motor 235 includes a stator and a rotator, and the rotator is rotated as AC power of each phase having a prescribed frequency is applied to a coil of the stator of each phase.

Examples of the motor 235 may include a surface mounted permanent magnet synchronous motor (SMPMSM), an interior permanent magnet synchronous motor (IPMSM), and a synchronous reluctance motor (SynRM). Among these motors, the SMPMSM and the IPMSM are characterized by presence of a permanent magnet, and the SynRM is characterized by absence of a permanent magnet.

The compressor microcomputer 430 may calculate power consumption of the entire refrigerator 1 based on the input current is detected by the input current detector A and the DC terminal voltage Vdc detected by the DC terminal voltage detector B. As described above, the compressor microcomputer 430 may calculate power consumption of the entire refrigerator 1 based on the above Equation 1.

Meanwhile, the compressor microcomputer 430 may transmit the calculated refrigerator power consumption to the main microcomputer 310.

Figure 8:
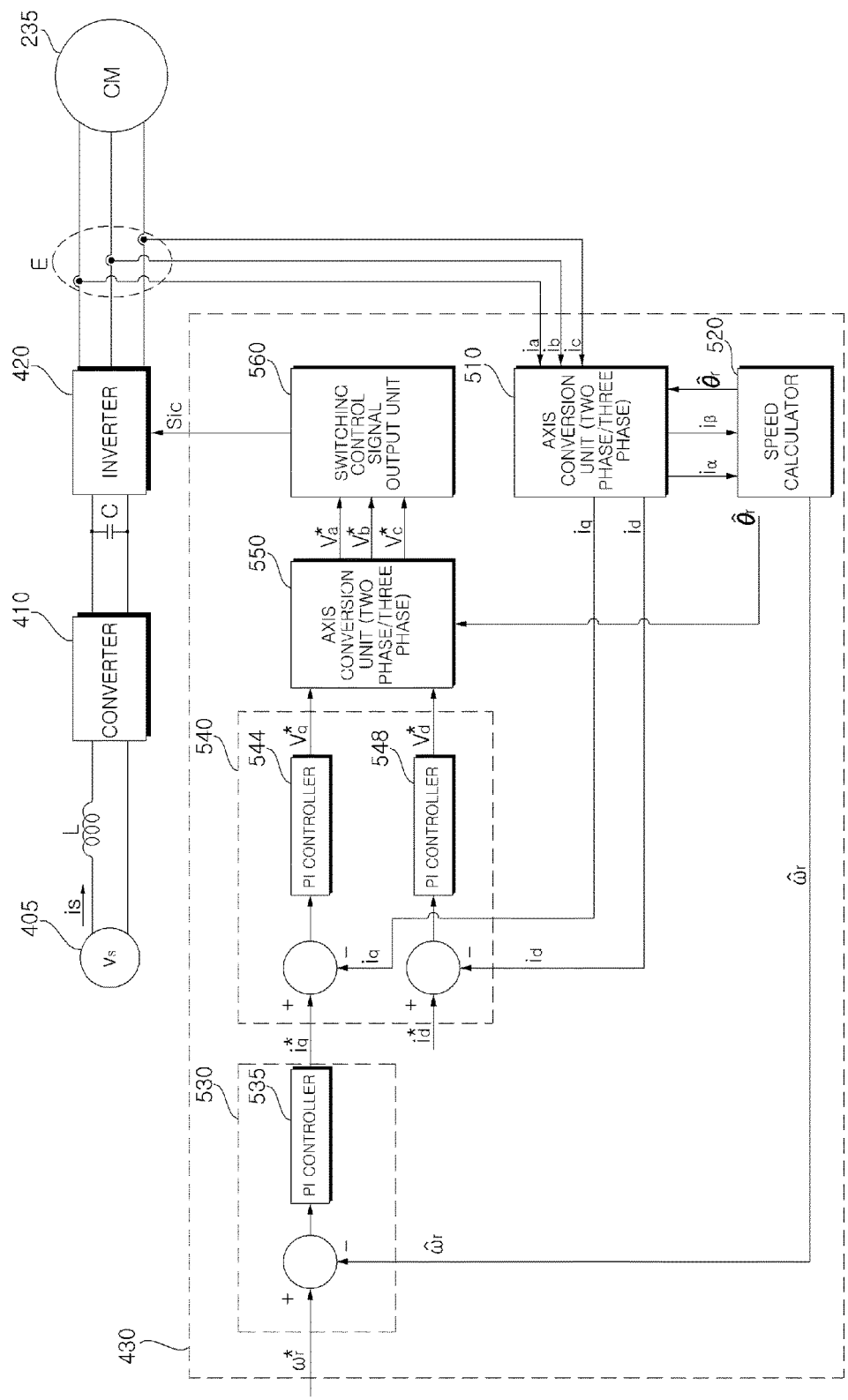
FIG. 8 is a circuit diagram showing one example of a compressor microcomputer shown in FIG. 7.

FIG. 8 is a circuit diagram showing one example of the compressor microcomputer shown in FIG. 7.

Referring to FIG. 8, the compressor microcomputer 430 may include an axis conversion unit 510, a speed calculator 520, a current command generator 530, a voltage command generator 540, an axis conversion unit 550, and a switching control signal output unit 560.

The axis conversion unit 510 receives three phase output current ia, ib and ic detected by the output current detector E and transforms the same into two phase current iα and iβ of a stationary coordinate system.

The axis conversion unit 510 may also perform transformation from the two phase current iα and iβ of the stationary coordinate system into two phase current id and iq of a rotational coordinate system.

The speed calculator 520 may output a position $\hat{\theta}_r$ and a speed $\hat{\omega}_r$, which are calculated based on the two phase current iα and iβ of the stationary coordinate system axis-transformed by the axis conversion unit 510.

The current command generator 530 generates current command $i^*_q$ based on the calculated speed $\hat{\omega}_r$ and a speed command $\omega^*_r$. For example, the current command generator 530 may perform PI control in a PI controller 535 based on a difference between the calculated speed $\hat{\omega}_r$ and the speed command $\omega^*_r$, and generate the current command $i^*_q$. While FIG. 8 shows a q-axis current command $i^*_q$ as a current command, alternatively, a d-axis current command $i^*_d$ may be concurrently generated. The d-axis current command $i^*_d$ may be set to zero.

The current command generator 530 may further include a limiter (not shown) to limit a level of the current command $i^*_q$ so as to prevent the current command $i^*_q$ from deviating from an allowable range.

Subsequently, the voltage command generator 540 generates d-axis and q-axis voltage commands $v^*_d$ and $v^*_q$ based on the d-axis and q-axis current id and iq of the two phase rotational coordinate system axis-transformed by the axis conversion unit and the current commands $i^*_d$ and $i^*_q$ from the current command generator 530. For example, the voltage command generator 540 may perform PI control in a PI controller 544 based on a difference between the q-axis current $i_q$ and the q-axis current command $i^*_q$, and generate the q-axis voltage command $v^*_q$. In addition, the voltage command generator 540 may perform PI control in a PI controller 548 based on a difference between the d-axis current $i_d$ and the d-axis current command $i^*_d$, and generate the d-axis voltage command $v^*_d$. The voltage command generator 540 may further include a limiter (not shown) to limit a level of the d-axis and q-axis voltage commands $v^*_d$ and $v^*_q$ so as to prevent the voltage commands $v^*_d$ and $v^*_q$ from deviating from an allowable range.

The generated d-axis and q-axis voltage commands $v^*_d$ and $v^*_q$ are inputted to the axis conversion unit 550.

The axis conversion unit 550 performs axis transformation upon receiving the calculated position $\hat{\theta}_r$ from the speed calculator 520 and the d-axis and q-axis voltage commands $v^*_d$ and $v^*_q$.

First, the axis conversion unit 550 performs transformation from a two phase rotational coordinate system into a two phase stationary coordinate system. In this case, the position $\hat{\theta}_r$ calculated by the speed calculator 520 may be used.

Then, the axis conversion unit 550 performs transformation from the two phase stationary coordinate system into a three phase stationary coordinate system. Through this transformation, the axis conversion unit 550 outputs three phase output voltage commands $v^*_a$, $v^*_b$ and $v^*_c$.

The switching control signal output unit 560 generates and outputs an inverter switching control signal Sic based on pulse width modulation using the three phase output voltage commands $v^*_a$, $v^*_b$ and $v^*_c$.

The output inverter switching control signal Sic may be converted into a gate drive signal by a gate driver (not shown) and inputted to a gate of each switching element included in the inverter 420. In this way, switching operation of the respective switching elements Sa, S'a, Sb, S'b, Sc and S'c included in the inverter 420 occurs.

Figure 9A:
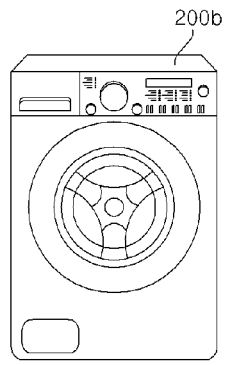
FIGS. 9(a)-9(d) are views showing various examples of a home appliance according to another embodiment of the present invention.
Figure 9B:
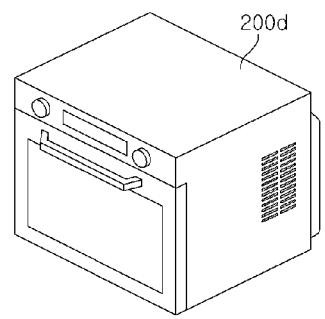
Figure 9C:
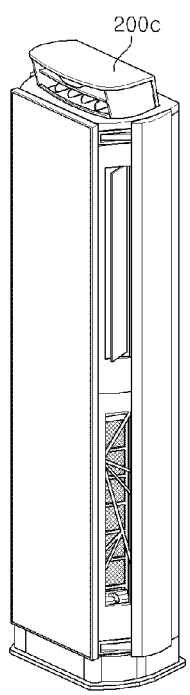
Figure 9D:
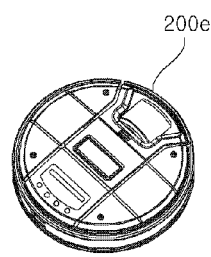
Figure 10:
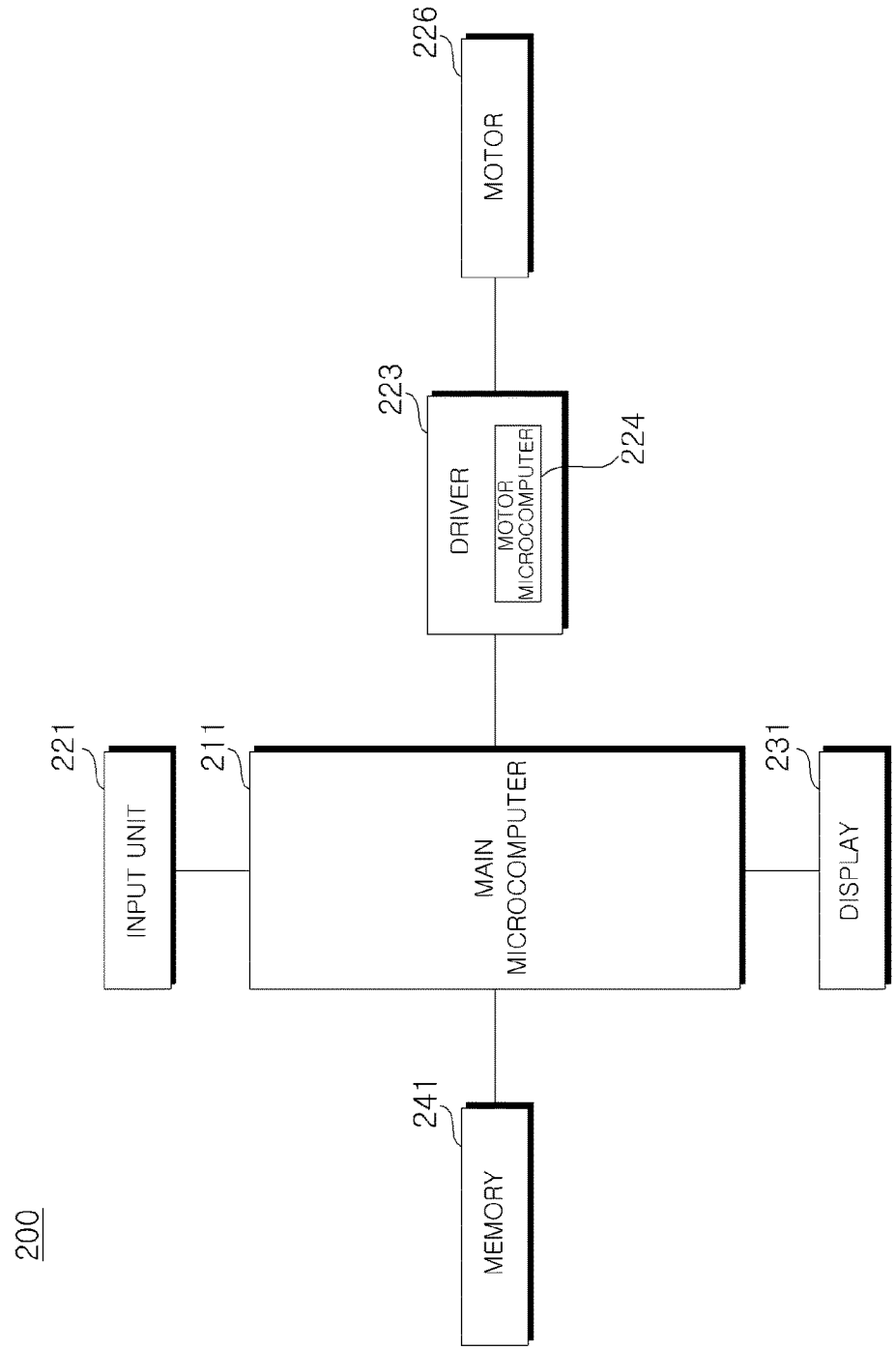
FIG. 10 is a block diagram schematically showing an internal configuration of the home appliance shown in FIG. 9.

FIGS. 9(a)-9(d) are views showing various examples of a home appliance according to another embodiment of the present invention, and FIG. 10 is a block diagram schematically showing an internal configuration of the home appliance shown in FIG. 9.

The home appliance according to the embodiment of the present invention may include a motor microcomputer that calculates power consumption of the home appliance based on input current detected by the input current detector A and DC terminal voltage detected by the DC terminal voltage detector B.

The home appliance may include the refrigerator 1 of FIG. 1, a washing machine 200b of FIG. 9(a), an air conditioner 200c of FIG. 9(b), a cooking appliance 200d of FIG. 9(c), a robot cleaner 200e of FIG. 9(d), or the like. The following description focuses on the washing machine 200b of FIG. 9(a), the air conditioner 200c of FIG. 9(b), the cooking appliance 200d of FIG. 9(c), and the robot cleaner 200e of FIG. 9(d), except for the refrigerator 1 of FIG. 1.

The home appliance 200 of FIG. 10 may include an input unit 221 for user input, a display 231 to display an operating state and the like of the home appliance, a driver 223 to drive the home appliance 200, a memory 241 to store product information, operation information and the like of the home appliance 200, and a main microcomputer 211 to control general operations of the home appliance 200.

In one example, when the home appliance is the washing machine 200b, the driver 223 may include a motor microcomputer 224 to drive a motor 226 that supplies torque to a drum or a tub. Here, the motor 226 may be a maximum power consuming unit.

In another example, when the home appliance is the air conditioner 200c, the driver 223 may include the motor microcomputer 224 to drive a compressor motor for an outdoor unit. Here, the compressor motor may be a maximum power consuming unit.

In another example, when the home appliance is the cooking appliance 200d, the driver 223 may include a microwave microcomputer (not shown) to control a magnetron to apply microwaves into a cavity of the cooking appliance 200d. Here, the magnetron may be a maximum power consuming unit.

In a further example, when the home appliance is the robot cleaner 200e, the driver 223 may include a fan motor for suction of air, or a motor microcomputer to drive a motor that is operated to move the robot cleaner 200e. Here, the fan motor and the motor to move the robot cleaner may be a maximum power consuming units.

The home appliance 200 may calculate power consumption of maximum power consuming units thereof and then calculate power consumption thereof using the calculated power consumption of the maximum power consuming units.

In one example, when the home appliance is the air conditioner 200c, the motor microcomputer 224 to drive the compressor motor may calculate air conditioner power consumption using input current and DC terminal voltage. As such, simplified calculation of air conditioner power consumption is possible.

In another example, when the home appliance is the washing machine 200b, the motor microcomputer 224 may calculate washing machine power consumption using input current and DC terminal voltage. As such, simplified calculation of washing machine power consumption is possible.

In another example, when the home appliance is the cooking appliance 200d, a microcomputer (not shown) equipped in the driver 223 may control an inverter (not shown) for production of microwaves, and calculate cooking appliance power consumption using input current and DC terminal voltage.

In a further example, when the home appliance is the robot cleaner 200e, the motor microcomputer 224 may calculate robot cleaner power consumption using input current and DC terminal voltage. As such, simplified calculation of robot cleaner power consumption is possible.

Figure 11:
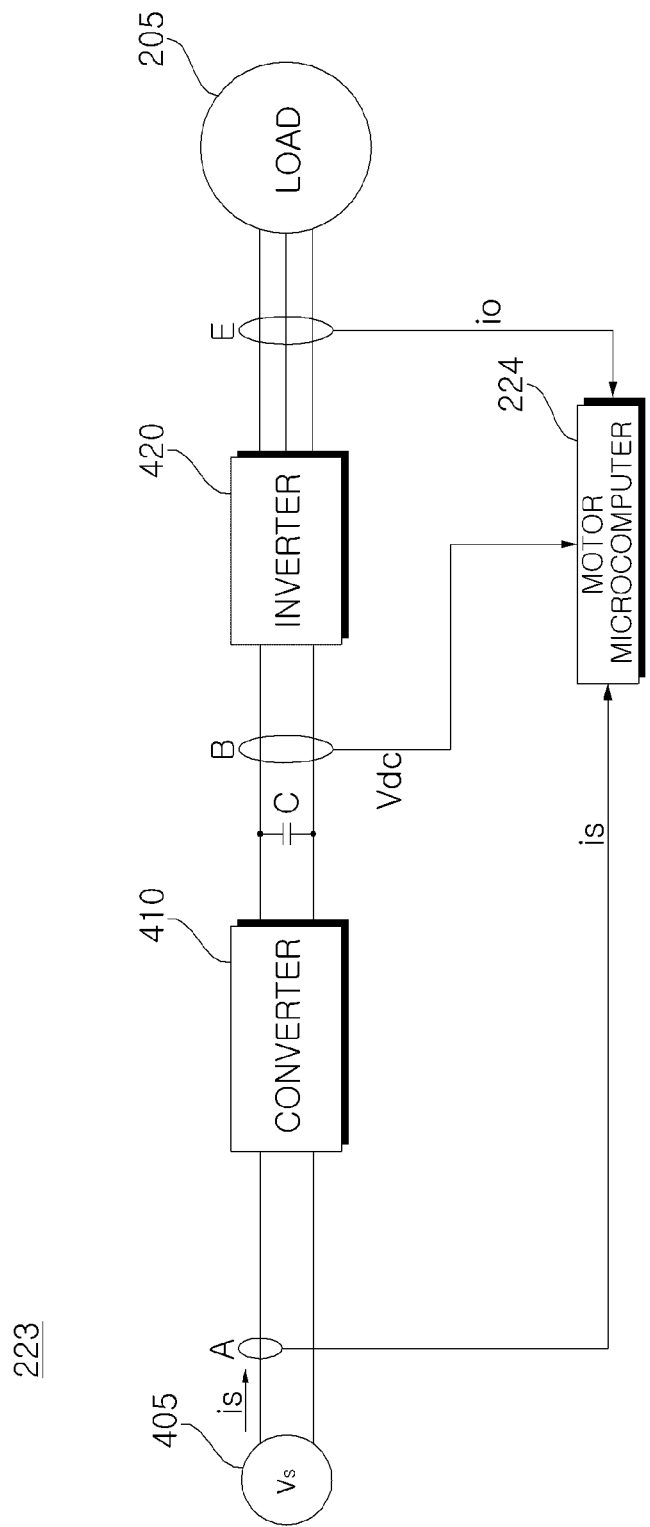
FIG. 11 is a circuit diagram showing a driver shown in FIG. 10.

FIG. 11 is a circuit diagram showing the driver shown in FIG. 10.

The driver 223 of FIG. 11 is similar to the compressor driver 113 of FIG. 7, except for a difference that the inverter 420 drives a load 205 rather than driving the compressor motor 235.

Thus, a description related to the converter 410 and the inverter will be omitted below.

The motor microcomputer 224 may calculate power consumption of the entire home appliance 200 based on input current is detected by the input current detector A and DC terminal voltage Vdc detected by the DC terminal voltage detector B as described above while controlling switching operation of the inverter 420. As described above, the motor microcomputer 224 may calculate power consumption of the entire home appliance 200 based on the above Equation 1.

Then, the motor microcomputer 224 may transmit the calculated power consumption of the home appliance 200 to the main microcomputer 211.

As is apparent from the above description, according to an embodiment of the present invention, a compressor microcomputer equipped in a refrigerator calculates refrigerator power consumption based on detected current and detected DC terminal voltage, which ensures simplified calculation of refrigerator power consumption.

In particular, the compressor microcomputer calculates refrigerator power consumption based on whether an AC heater and a compressor, which are the greatest power consuming units of the refrigerator, are operated or not, which ensures accurate power consumption calculation.

A refrigerator and a home appliance according to the present invention should not be limited to configurations and methods of the above-described embodiments, and all or some of the embodiments may be selectively combined with one another to achieve various alterations.

In addition, a method of operating a refrigerator according to an embodiment of the present invention may be implemented as code that may be written on a processor readable recording medium and thus, read by a processor provided in the refrigerator. The processor readable recording medium may be any type of recording device in which data is stored in a processor readable manner. Examples of the processor readable recording medium may include a ROM, a RAM, a CD-ROM, a magnetic tape, a floppy disc, and an optical data storage device. In addition, the processor readable recording medium includes a carrier wave (e.g., data transmission over the Internet). Also, the processor readable recording medium may be distributed over a plurality of computer systems connected to a network so that processor readable code is written thereto and executed therefrom in a decentralized manner.

Although the preferred embodiments of the present invention have been disclosed for illustrative purposes, those skilled in the art will appreciate that various modifications, additions and substitutions are possible without departing from the scope and spirit of the invention as disclosed in the accompanying claims.

What is claimed is:

1. A refrigerator comprising:
a compressor;
an input current detector to detect input current of alternating current (AC) power from a commercial AC power source inputted to the refrigerator;
a converter to convert the inputted AC power into direct current (DC) power;
a capacitor to store the converted DC power;
a relay located between the commercial AC power source and the converter;
an AC heater connected to the relay, and operated based on the received input AC power by turn-on operation of the relay;
a voltage dropper to output dropped DC power using the DC power from the capacitor;
a main microcomputer to operate based on the dropped DC power from voltage dropper;
a DC heater to operate based on the dropped DC power from voltage dropper;
an inverter to output AC power using the converted DC power from the capacitor for driving of the compressor;
a DC terminal voltage detector to detect voltage at two terminals of the capacitor; and
a compressor microcomputer to control the inverter and to calculate refrigerator power consumption based on the detected input current and the detected DC terminal voltage,
wherein the input current detector located between the commercial AC power source and the relay,
wherein the compressor microcomputer includes a power factor table of power factor values corresponding to whether or not the compressor is operated,
wherein the refrigerator power consumption is calculated by the compressor microcomputer based on the detected input current, the detected DC terminal voltage, and the power factor table, and
wherein a greater power factor value is set by the compressor microcomputer when the AC heater is operated than a power factor value when the compressor is operated, and the refrigerator power consumption is calculated by the compressor microcomputer based on the set power factor value.

2. The refrigerator according to claim 1, wherein a greater power factor value is set by the compressor microcomputer when the compressor is operated to supply cold air into a refrigerating compartment than a power factor value when the compressor is operated to supply cold air into a freezing compartment, and the refrigerator power consumption is calculated by the compressor microcomputer based on the set power factor value.

3. The refrigerator according to claim 1,
wherein the refrigerator power consumption is calculated by the compressor microcomputer using a first power factor value when the compressor is operated to supply cold air into a freezing compartment,
wherein the refrigerator power consumption is calculated by the compressor microcomputer using a second power factor value when the compressor is operated to supply cold air into a refrigerating compartment,
wherein the refrigerator power consumption is calculated by the compressor microcomputer using a third power factor value when the AC heater is operated, and
wherein the first power factor value is less than the second power factor value, and the second power factor value is less than the third power factor value.

4. A refrigerator comprising:
a compressor;
an input current detector to detect input current of alternating current (AC) power from a commercial AC power source inputted to the refrigerator;
a converter to convert the inputted AC power into direct current (DC) power;
a capacitor to store the converted DC power;
a relay located between the commercial AC power source and the converter;
an AC heater connected to the relay, and operated based on the received input AC power by turn-on operation of the relay;
a voltage dropper to output dropped DC power using the DC power from the capacitor;
a main microcomputer to operate based on the dropped DC power from voltage dropper;
a DC heater to operate based on the dropped DC power from voltage dropper;
an inverter to output AC power using the converted DC power from the capacitor for driving of the compressor;
a DC terminal voltage detector to detect voltage at two terminals of the capacitor; and
a compressor microcomputer to control the inverter and to calculate refrigerator power consumption based on the detected input current and the detected DC terminal voltage,
a relay located between the commercial AC power source and the converter;
an AC heater connected to the relay, and operated based on the received input AC power by turn-on operation of the relay; and
a memory,
wherein power factor values respectively corresponding to a case of the compressor being operated to supply cold air into a freezing compartment, a case of the compressor being operated to supply cold air into a refrigerating compartment, and a case of the AC heater being operated are stored as a power factor table in the memory or the compressor microcomputer, and
wherein a greater power factor value is set by the compressor microcomputer when the AC heater is operated than a power factor value when the compressor is operated, and the refrigerator power consumption is calculated by the compressor microcomputer based on the set power factor value.

5. The refrigerator according to claim 1, wherein the refrigerator power consumption is calculated by the compressor microcomputer based on whether the compressor is operated or not and whether the AC heater is operated or not.

6. The refrigerator according to claim 1, further comprising:
a display,
wherein the main microcomputer controls the display,
wherein the calculated refrigerator power consumption is transmitted by the compressor microcomputer to the main microcomputer, and
wherein the display of the received refrigerator power consumption on the display is controlled by the main microcomputer.

7. The refrigerator according to claim 6, wherein the display is controlled by the main microcomputer to display refrigerator power consumption information for a prescribed period, to compare and display refrigerator power consumption information between different periods, to display refrigerator power consumption information at a given interval, or to display refrigerator power consumption information for a given time.

8. A home appliance comprising:
an input current detector to detect input current of alternating current (AC) power from a commercial AC power source inputted to the home appliance;
a converter to convert the inputted AC power into direct current (DC) power;
a capacitor to store the converted DC power;
a relay located between the commercial AC power source and the converter;
an AC heater connected to the relay, and operated based on the received input AC power by turn-on operation of the relay;
a voltage dropper to output dropped DC power using the DC power from the capacitor;
a main microcomputer to operate based on the dropped DC power from voltage dropper;
a DC heater to operate based on the dropped DC power from voltage dropper;
an inverter to output AC power to a load using the DC power from the capacitor;
a DC terminal voltage detector to detect voltage at two terminals of the capacitor; and
a motor microcomputer to control the inverter and to calculate home appliance power consumption based on the detected input current and the detected DC terminal voltage,
wherein the input current detector located between the commercial AC power source and the relay,
wherein the motor microcomputer includes a power factor table of power factor values corresponding to whether or not the load is operated,
wherein the motor microcomputer calculates the refrigerator power consumption based on the detected input current, the detected DC terminal voltage, and the power factor table, and
wherein a greater power factor value is set by the compressor microcomputer when the AC heater is operated than a power factor value when the compressor is operated, and the refrigerator power consumption is calculated by the compressor microcomputer based on the set power factor value.

9. The home appliance according to claim 8, further comprising:
a display,
wherein the main microcomputer controls the display,
wherein the calculated home appliance power consumption is transmitted by the motor microcomputer to the main microcomputer, and
wherein the display of the received home appliance power consumption on the display is controlled by the main microcomputer.

10. The home appliance according to claim 8, wherein power consumption of at least one maximum power consuming unit is calculated by the home appliance, and power consumption of the home appliance is calculated using the calculated power consumption of the maximum power consuming unit.

* * * * *